United States Patent

Hsu

Patent Number: 6,096,633
Date of Patent: Aug. 1, 2000

[54] DUAL DAMASCENE PROCESS FOR FORMING LOCAL INTERCONNECT

[75] Inventor: Chen-Chung Hsu, Taichung, Taiwan

[73] Assignee: United Microelectronics Corp., Hsinchu, Taiwan

[21] Appl. No.: 09/181,301

[22] Filed: Oct. 28, 1998

[51] Int. Cl.$^7$ ................. H01L 21/4763; H01L 23/48; H01L 29/40

[52] U.S. Cl. ............ 438/622; 438/619; 438/723; 438/724; 438/738; 438/743; 438/744; 257/758

[58] Field of Search .................... 438/622, 619, 438/722, 723, 724, 725, 738, 740, 743, 744; 257/758, 760

[56] References Cited

U.S. PATENT DOCUMENTS

| | | | |
|---|---|---|---|
| 3,539,705 | 11/1970 | Nathanson et al. | 174/254 |
| 5,567,982 | 10/1996 | Bartelink | 257/664 |
| 5,933,761 | 8/1999 | Lee | 438/783 |
| 5,949,143 | 9/1999 | Bang | 257/758 |

*Primary Examiner*—John F. Niebling
*Assistant Examiner*—Ha Tran Nguyen
*Attorney, Agent, or Firm*—Thomas, Kayden, Horstemeyer & Risley

[57] ABSTRACT

A method of forming local interconnects uses a dual damascene process. The process comprises the steps of first providing a substrate, and then forming a first insulating layer over the substrate. Then, a pillar-shaped second insulating layer is formed over the first insulating layer. Thereafter, a first conductive layer is formed over the first insulating layer and the second insulating layer, and then a third insulating layer is formed over the first conductive layer. In the subsequent step, a portion of the third insulating layer and the first conductive layer is polished away using a chemical-mechanical polishing operation, stopping at the surface of the second insulating layer. Next, a fourth insulating layer is formed over the third insulating layer, the second insulating layer and the first conductive layer, wherein the fourth insulating layer and the second insulating layer are made from the same material. Then, the fourth insulating layer is etched to remove the fourth insulating layer above the second insulating layer and the entire second insulating layer, thereby forming a self-aligning via. Subsequently, a second conductive material is deposited over the substrate and into the self-aligning via to form a second conductive layer. Finally, a chemical-mechanical polishing method is again used to polish away a portion of the second conductive layer, stopping at the upper surface of the fourth insulating layer.

9 Claims, 6 Drawing Sheets

DUAL DAMASCENE PROCESS FOR FORMING LOCAL INTERCONNECT

BACKGROUND OF THE INVENTION

1. Field of the Invention

The present invention relates to a method of forming a local interconnect. More particularly, the present invention relates to a method of forming a local interconnect using a dual damascene process with self-aligning properties.

2. Description of Related Art

In many highly integrated semiconductor products, designs having two or more metallic interconnect layers, know also as multi-level interconnects, are often used. The reason for having a three-dimensional wiring line structure is for accommodating the increased interconnection due to an increase in device density. In general, multi-level interconnects are formed by first providing a first layer or a lower layer of metallic wiring and interconnect structure. Then, a second layer of metallic wiring for connecting with the first layer of metallic wiring and interconnect structure is formed. The first layer of metallic wiring is usually a polysilicon layer or a metallic layer, and the first layer of metallic wiring is electrically connected to one of the source/drain regions of a substrate. In order to connect to more devices, a second layer or more layers of the metallic wiring are used.

When dimensions of the devices are reduced to the deep-submicron range, a number of defects emerge when using the aforementioned method. For example, if the conductive material for forming the plug is copper, there are be some difficulties in providing an appropriate etchant for etching back the copper layer. In addition, difficulties in fabricating the wiring line structures increase, especially when metal is being deposited into a via plug or when dielectric material is being deposited into the recess cavities between metallic wiring.

Due to poor step coverage of the metal, voids may be generated between the metallic wires and some impurities may be trapped in between these areas. Consequently, an alternative method called a dual damascene method is more frequently used. The dual damascene method of forming interconnects is able to avoid most of the defects that are due to a reduction in device dimensions. Moreover, a planarized dielectric layer surface is eventually obtained.

Normally, the via plug of a multi-level metallic interconnect is formed by first forming an insulating layer over a metallic layer, and then forming a patterned photoresist layer over the insulating layer. Thereafter, etching is carried out to form a via hole, and then conductive material is deposited into the via hole. In general, the conductive material for forming the via plug is tungsten. Finally, metallic interconnects for connecting devices are formed over the insulating layer, thereby completing the process of fabricating a multi-level metallic interconnect. The process of fabricating a multi-level metallic interconnect is explained further with reference to FIGS. 1A through 1H.

FIGS. 1A through 1H are cross-sectional views showing the progression of manufacturing steps in producing interconnects according to a conventional method.

First, as shown in FIG. 1A, a substrate structure 100 (to simplify the figure, devices within the substrate structure 100 are not drawn) having a planarized surface is provided. Then, a metallic layer 101 is formed over the substrate structure 100. Thereafter, a patterned photoresist layer 104 is formed over the metallic layer 101 so that areas for forming metallic wires are covered.

Next, as shown in FIG. 1B, the metallic layer 101 is etched using the photoresist layer 104 as a mask. Hence, metallic lines 101a and 101b are formed above the substrate structure 100 while the substrate surface is exposed. Thereafter, the photoresist layer 104 is removed.

In the subsequent step, as shown in FIG. 1C, an insulating layer 105, for example, a silicon oxide layer is deposited over the substrate structure 100. Then, excess insulating layer 105 above the metallic lines 101a and 101b is removed using, for example, a chemical-mechanical polishing (CMP) method. Ultimately, the top surfaces of the metallic lines 101a and 101b are exposed.

Next, as shown in FIG. 1D, another insulating layer 106 a silicon oxide layer, for example, is deposited over the substrate structure 100, covering the metallic lines 101a, 101b and the insulating layer 105. The thickness of the insulating layer 106 depends on the height of the vertical plug required. Thereafter, the insulating layer 106 is planarized, and then another patterned photoresist layer 114 that exposes the area for forming a via hole is formed over the insulating layer 106. The via hole should correspond in position to the conductive line 101a.

Next, as shown in FIG. 1E, the insulating layer 106 is etched using the photoresist layer 114 as a mask. Hence, a via hole 107 that exposes the conductive line 101a is formed within the insulating layer 106a. Thereafter, the photoresist layer 114 is removed. As the line width of semiconductor devices continue to be reduced, misalignment problems intensify when the via hole 107 is formed above the conductive line 101a using the conventional process.

Next, as shown in FIG. 1F, a glue/barrier layer 112 conformal to the via hole surface is deposited over the substrate structure 100. The glue/barrier layer 112 mainly serves to increase the adhesion between a subsequently deposited metallic layer and other materials. Thereafter, the metallic layer is deposited over the substrate structure 100. For example, a layer of tungsten is deposited over the substrate and fills the via hole 107 using, for example, a chemical vapor deposition method. Consequently, a tungsten plug that couples electrically with the conductive line 101a is formed. After that, an etching back operation is carried out to remove excess metal on the surface of the insulating layer 106a, thereby forming a metal plug 110. However, in the above conventional process of depositing metal into the via hole, problems caused by poor step coverage of the metal often occur.

Next, as shown in FIG. 1G, yet another metallic layer 111 is deposited over the substrate structure 100, and then the metallic layer 111 is planarized. A patterned photoresist layer 124 is again formed on the surface of the metallic layer 111, covering areas for forming other interconnecting lines.

Next, as shown in FIG. 1H, the metallic layer 111 is etched using the photoresist layer 124 as a mask. Finally, the photoresist layer 124 is removed to form a conductive line 111a above the substrate structure 100, wherein the conductive line 111a couples electrically with the metal plug 110.

At present, another method known as a dual damascene process is often used in the fabrication of interconnects. The dual damascene technique provides a more stable and reliable method of fabricating integrated circuits. The technique makes used of a chemical-mechanical polishing (CMP) operation to form the required metallic line pattern, unlike the conventional method that requires an etching back operation. Hence, a host of metals including, for example, aluminum, copper and aluminum alloy can be selected. With this many metals to choose from, metallic interconnects having suitable resistance level and electromigration property can be found. Therefore, the dual damascene method has been used in fabricating highly efficient and highly stable metallic interconnects for VLSI circuits having a line width smaller than 0.25 μm.

FIGS. 2A through 2D are cross-sectional views showing the progression of manufacturing steps in fabricating metallic interconnects using a conventional dual damascene process. First, as shown in FIG. 2A, a semiconductor substrate 200 is provided. Then, an inter-metal dielectric layer 201, preferably an oxide layer, is deposited over the substrate 200. Thereafter, a first photolithographic and etching operation is carried out to from an opening 202 in the inter-metal dielectric layer 201.

Next, as shown in FIG. 2B, a second photolithographic and etching operation is carried out to form a second opening 203 that exposes the semiconductor substrate 200 at the bottom of the first opening 202. The second opening 203 has a width smaller than the width of the first opening 202.

Next, as shown in FIG. 2C, metallic material is deposited into the first opening 202 and the second openings 203 to form a metallic layer 204. Here, the width of the first opening 202 must be wider so that operation will not be limited by the resolution of photolithography.

Thereafter, as shown in FIG. 2D, the metallic layer 204 is etched back or polished using a chemical-mechanical polishing (CMP) method until the upper surface of the inter-metal dielectric layer 201 is exposed. Ultimately, the metallic layer 204 and the inter-metal dielectric layer are at the same height level.

In summary, as line width of semiconductor devices continues to be reduced, conventional methods of fabricating interconnects have at least the following defects:

1. The conventional method of depositing metal into a via hole often leads to the generation of voids due to poor step coverage of the metal. Furthermore, a glue/barrier layer must be formed prior to the formation of the tungsten plug so that adhesion between subsequently deposited metallic layer and other materials can be increased.
2. Misalignment often occurs when via holes are patterned over the conductive lines.
3. The convention method of fabrication involves a large number of steps. Therefore, production time is longer and production cost is higher.

In light of the foregoing, there is a need to provide abetter method of fabricating interconnects with dual damascene process.

SUMMARY OF THE INVENTION

Accordingly, the present invention is to provide a dual damascene process for fabricating a local interconnect that can reduce defects caused by the use of conventional methods and improve the production of metallic interconnects in the deep submicron regime.

To achieve these and other advantages and in accordance with the purpose of the invention, as embodied and broadly described herein, the invention provides a dual damascene process of forming local interconnects. The process comprises the steps of first providing a substrate, and then forming a first insulating layer over the substrate. Then, a pillar-shaped second insulating layer is formed over the first insulating layer. The first insulating layer and the second insulating layer are made from different materials. Thereafter, a fist conductive layer is formed over the first insulating layer and the second insulating layer, and then a third insulating layer is formed over the first conductive layer. The third insulating layer and the second insulating layer are again formed from different materials. In the subsequent step, a portion of the third insulating layer and the first conductive layer is polished using a chemical-mechanical polishing operation, stopping at the surface of the second insulating layer. Next, a fourth insulating layer is formed over the third insulating layer, the second insulating layer and the first conductive layer, wherein the fourth insulating layer and the second insulating layer are made from the same material. Then, the fourth insulating layer is etched to remove the fourth insulating layer above the second insulating layer and the entire second insulating layer, thereby forming a self-aligning via. Subsequently, a second conductive material is deposited over the substrate and into the self-aligning via to form a second conductive layer. Finally, a chemical-mechanical polishing method is again used to polish away a portion of the second conductive layer, stopping at the surface of the fourth insulating layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
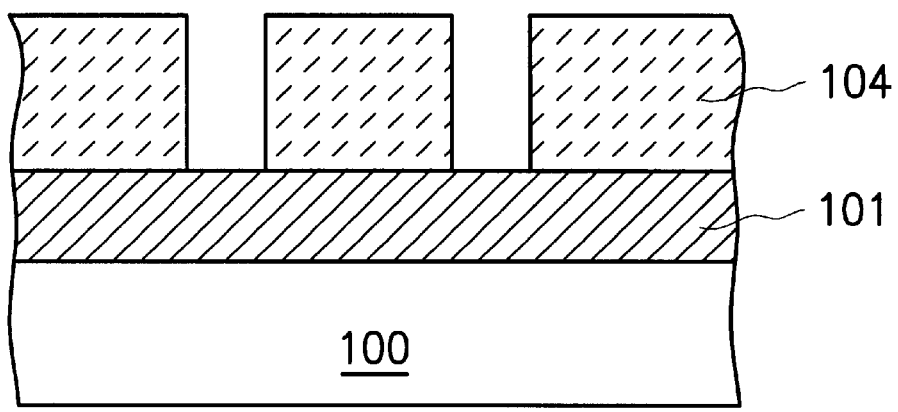
FIGS. 1A through 1H are cross-sectional views showing the progression of manufacturing steps in producing interconnects according to a conventional method.
Figure 1B:
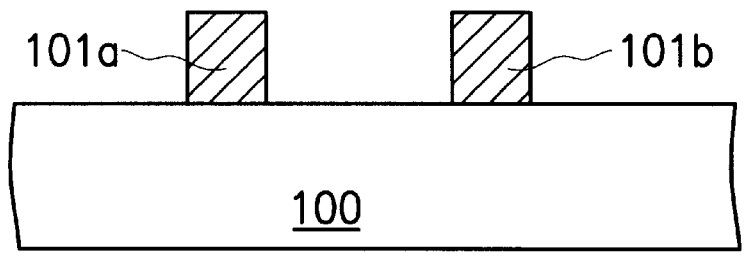
Figure 1C:
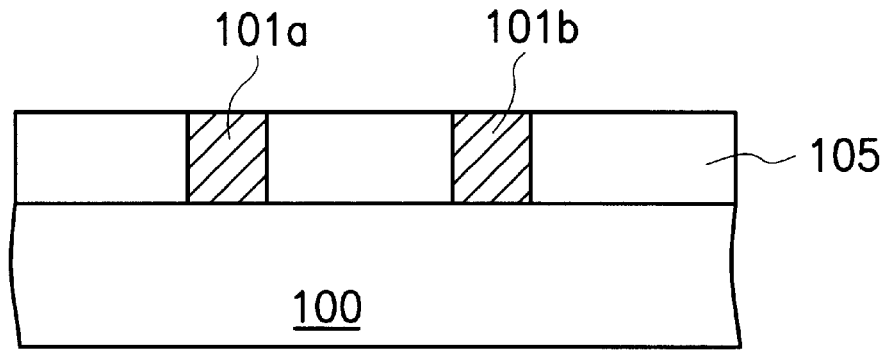
Figure 1D:
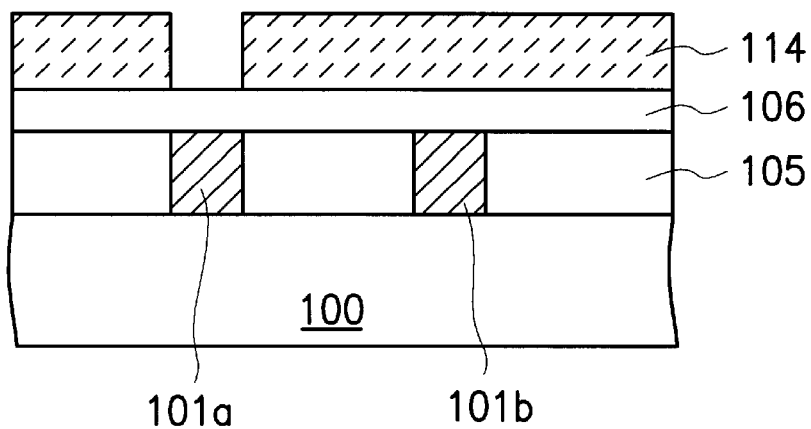
Figure 1E:
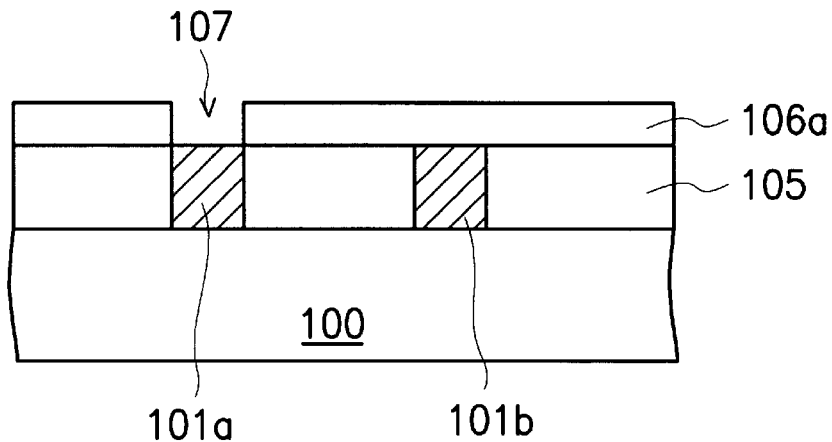
Figure 1F:
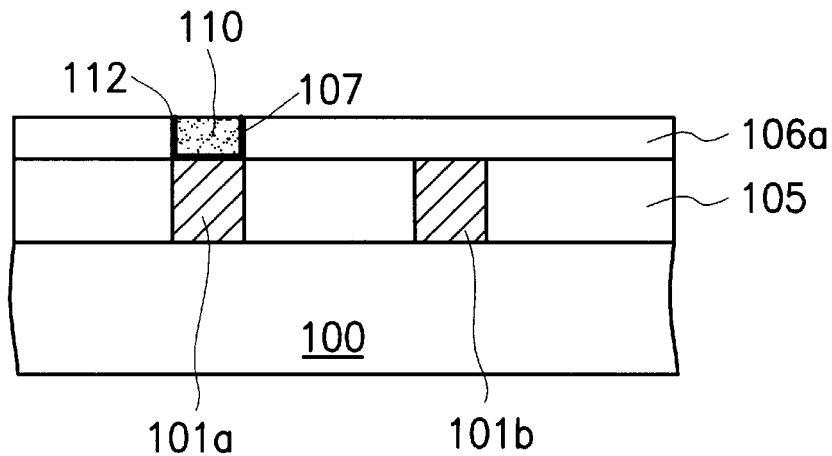
Figure 1G:
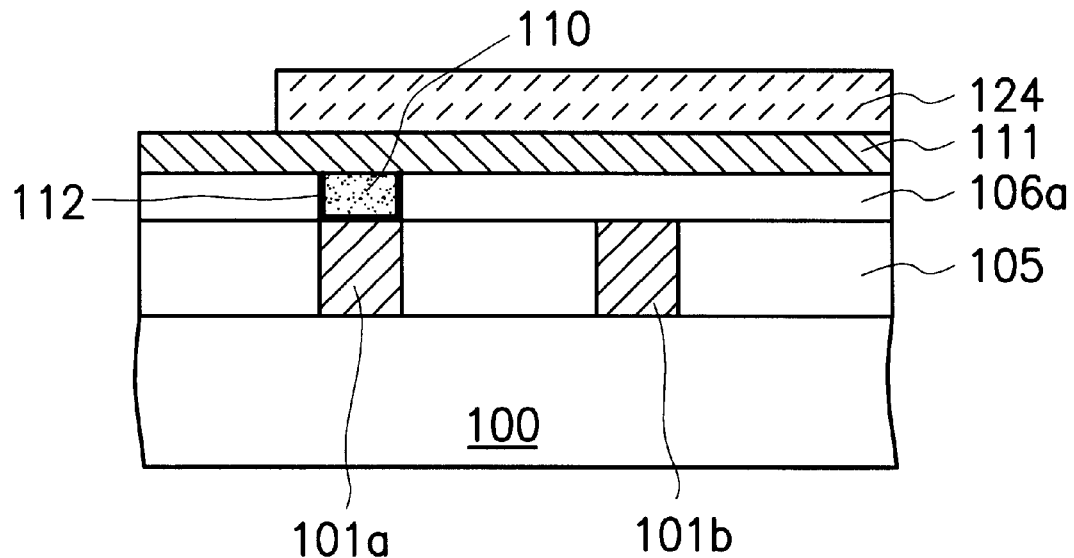
Figure 1H:
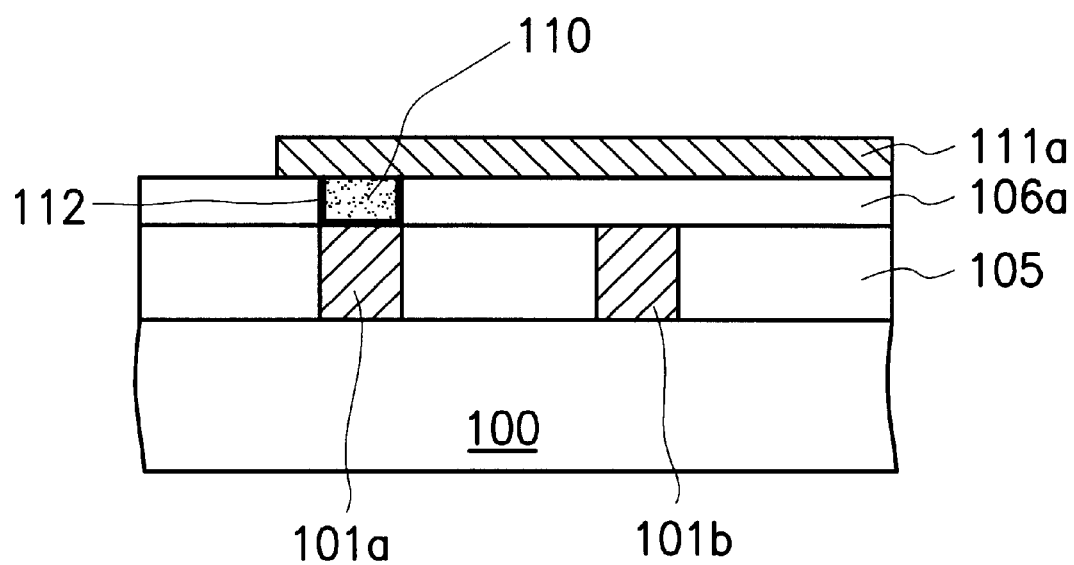
Figure 2A:
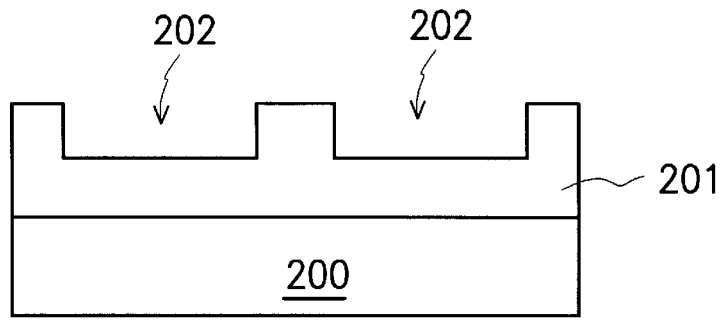
FIGS. 2A through 2D are cross-sectional views showing the progression of manufacturing steps in fabricating a metallic interconnect using a conventional dual damascene process.
Figure 2B:
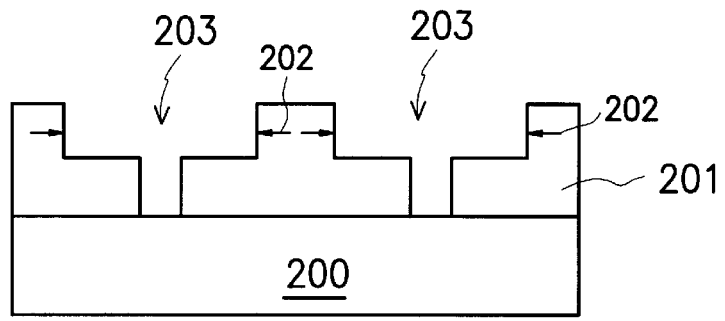
Figure 2C:
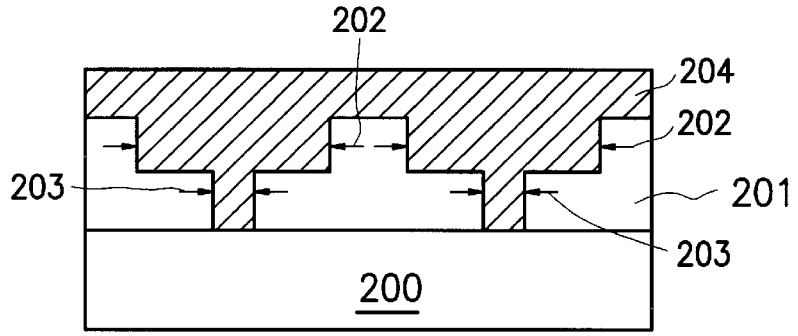
Figure 2D:
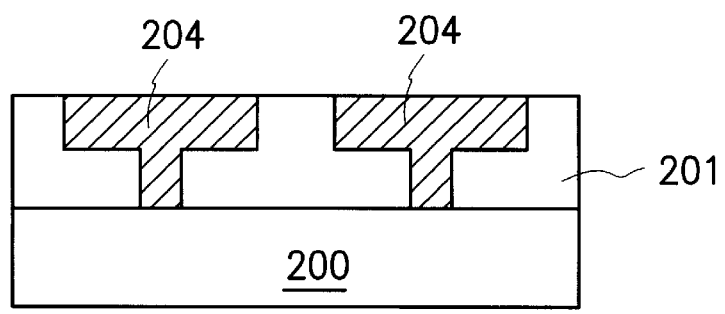

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3E are cross-sectional views showing the progression of manufacturing steps in fabricating a local interconnect using a dual damascene process according to this invention.

Figure 3A:
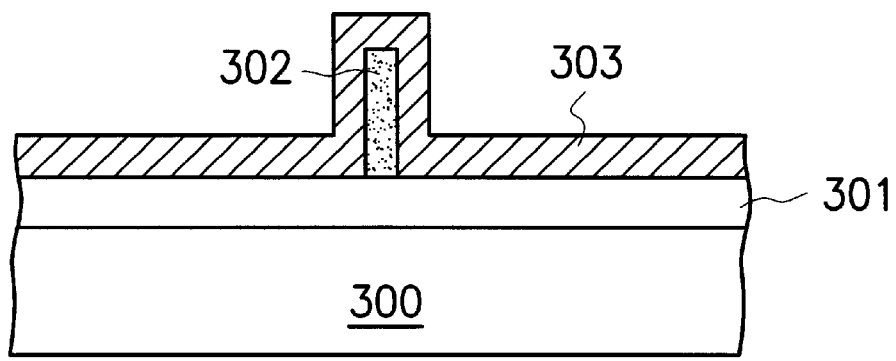
FIGS. 3A through 3E are cross-sectional views showing the progressing of manufacturing steps in fabricating a local interconnect using a dual damascene process according to this invention.

First, as shown in FIG. 3A, a substrate 300 (to simplify the figure, devices within the substrate 300 are not drawn) is provided, and then a first insulating layer 301 is formed over the substrate 300. Then, a pillar-shaped second insulating layer 302 is formed over the first insulating layer 301. The second insulating layer 302 has a thickness roughly equal to the combined thickness of a metallic layer and a via opening. Moreover, the first insulating layer 301 and the second insulating layer 302 are made from different materials. The first insulating layer 301 and the second insulating layer 302, for example, can be an oxide layer and a silicon nitride layer, respectively. Alternatively, the first insulating layer 301 can be a silicon nitride layer while the second insulating layer 302 can be an oxide layer. Thereafter, a first conductive layer 303 is formed over the first insulating layer 301 and the second insulating layer 302. The first conductive layer 303 can be a metallic layer formed by a sputtering method, for example.

Figure 3B:
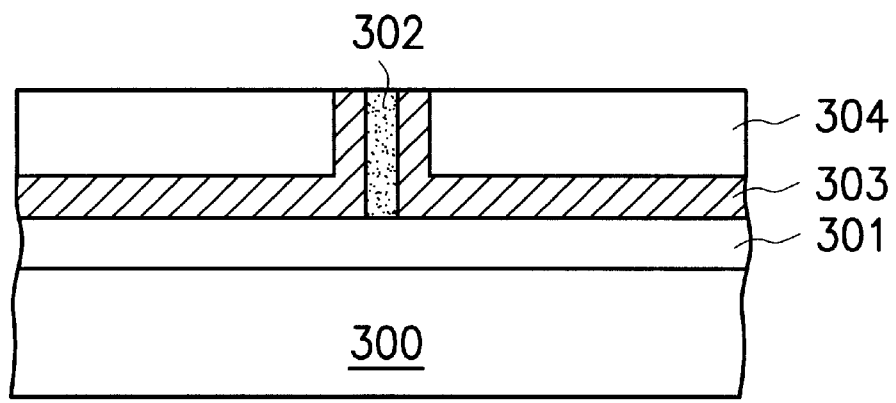

Next, as shown in FIG. 3B, a third insulating layer 304 is formed over the first conductive layer 303. The third insulating layer 304 and the second insulating layer 301 are made from different materials. Thereafter, a portion of the third insulating layer 304 and a portion of the first conductive layer 303 are removed using a chemical-mechanical polishing method. Polishing stops at the second insulating layer.

Figure 3C:
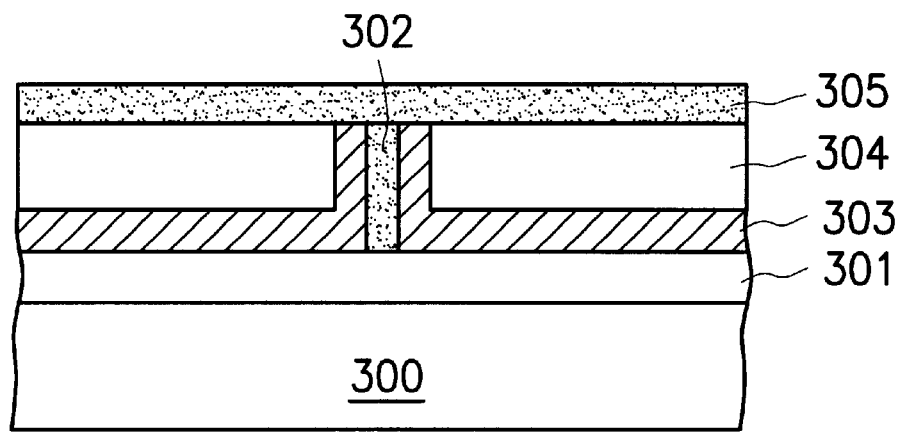

Next, as shown in FIG. 3C, a fourth insulating layer 305 is formed over the third insulating layer 304, the second insulating layer 302 and the first conductive layer 303. The fourth insulating layer 305 and the second insulating layer 303 can be made from the same material, and the fourth insulating layer 305 can have a thickness roughly equal to the thickness of a metallic layer.

Figure 3D:
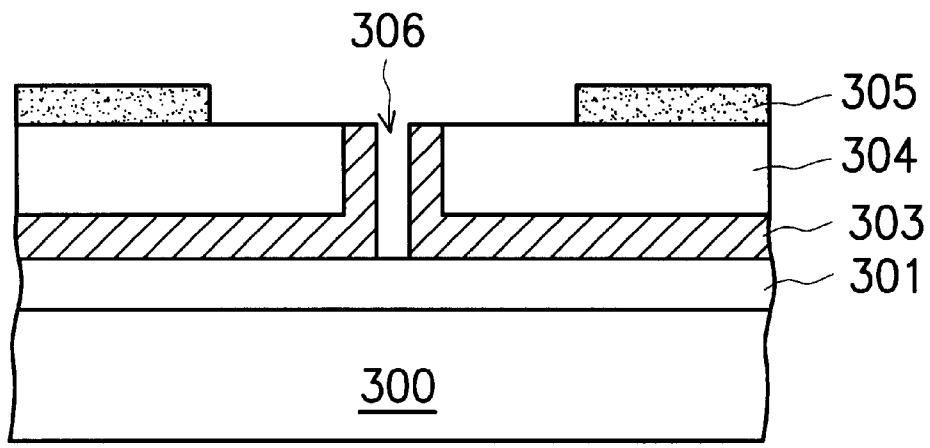

Next, as shown in FIG. 3D, the fourth insulating layer 305 is etched to remove a portion of the fourth insulating layer 305 over the second insulating layer 302 and to remove the entire second insulating layer 302. Ultimately, a self-aligning via 306 is formed. For example, using a mask layer (not shown) as an etching mask, a dry etching operation is carried out to pattern the fourth insulating layer 305 and remove the second insulating layer 302. Because the fourth insulating layer 305 and the second insulating layer 302 are made from the same material, and the two layers are made from a material that differs from the first insulating layer 301 and the third insulating layer 304, the first conductive layer 303 and the third insulating layer 304 can act as an etching barrier layer while the first insulating layer 301 can act as an etching stop layer.

Figure 3E:
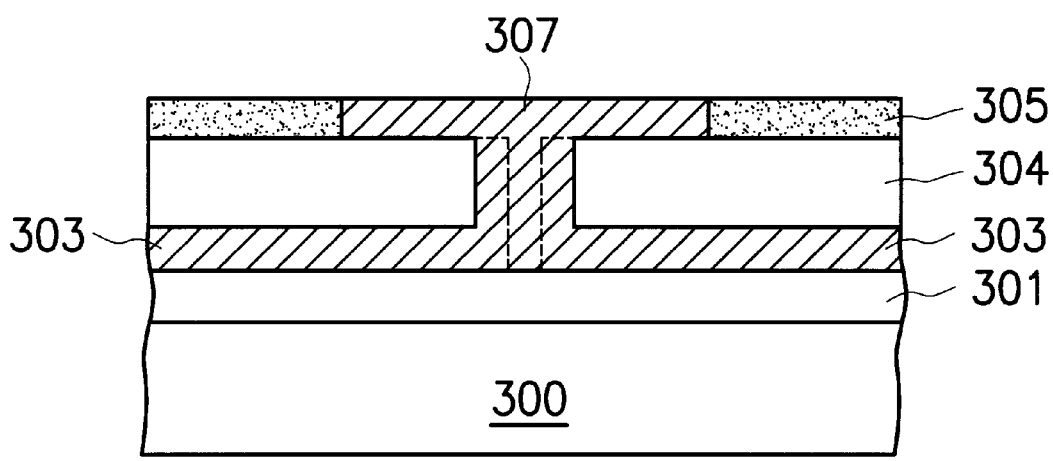

Subsequently, as shown in FIG. 3E, conductive material is deposited into the self-aligning via 306 (FIG. 306) and over the substrate 300 to form a second conductive layer 307. Finally, chemical-mechanical polishing method is used to polish away a portion of the second conductive layer 307. Polishing stops when the fourth insulating layer 305 is reached.

In summary, the advantages of using the dual damascene processing method of this invention to form a local interconnect include:

1. A self-aligning via is formed in this invention. Therefore, conventional misalignment problems can be avoided.
2. Height variation on the upper surface resulting from using the conventional etching technique to form local interconnects is eliminated. In a dual damascene process, the upper surface is be planarized by a final polishing operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a local interconnect that uses a dual damascene process, the method comprising the steps of:

providing a substrate;

forming a first insulating layer over the substrate;

forming a pillar-shaped second insulating layer over the first insulating layer, wherein the first insulating layer and the second insulating layer are made from different materials;

forming a first conductive layer over the first insulating layer and the second insulating layer;

forming a third insulating layer over the first conductive layer, wherein the third insulating layer and the second insulating layer are made from different materials;

polishing away a portion of the third insulating layer and the first conductive layer using a chemical-mechanical polishing method, stopping at an upper surface of the second insulating layer;

forming a fourth insulating layer over the third insulating layer, the second insulating layer and the first insulating layer, wherein the fourth insulating layer and the second insulating layer are made from the same material;

etching the fourth insulating layer using a mask layer to remove a portion of the fourth insulating layer over the second insulating layer and the entire second insulating layer to form a self-aligning via;

forming a second conductive layer over the substrate such that the second conductive layer also fills completely the self-aligning via; and polishing away a portion of the second conductive layer using a chemical-mechanical polishing method, stopping at an upper surface of the fourth insulating layer.

2. The method of claim 1, wherein the step of forming the first insulating layer and the third insulating layer includes depositing oxide material to form oxide layers, and the step of forming the second insulating layer and the fourth insulating layer includes depositing silicon nitride to form silicon nitride layers.

3. The method of claim 1, wherein the step of forming the first insulating layer and the third insulating layer includes depositing silicon nitride to form silicon nitride layers, and the step of forming the second insulating layer and the fourth insulating layer includes depositing oxide material to form oxide layers.

4. The method of claim 1, wherein the step of forming the first conductive layer includes depositing metallic material.

5. The method of claim 4, wherein the step of forming the metallic layer includes a sputtering method.

6. The method of claim 1, wherein the step of forming the second conductive layer includes depositing metallic material.

7. The method of claim 6, wherein the step of forming the metallic layer includes a sputtering method.

8. The method of claim 1, wherein the mask layer includes a photoresist layer.

9. The method of claim 1, wherein the step of removing fourth insulating layer above the second insulating layer and the entire second insulating layer includes using a dry etching method.

* * * * *